United States Patent
Oh et al.

(10) Patent No.: US 11,038,144 B2
(45) Date of Patent: Jun. 15, 2021

(54) ORGANIC LIGHT-EMITTING DISPLAY APPARATUS

(71) Applicant: Samsung Display Co., Ltd., Yongin (KR)

(72) Inventors: Min-Ho Oh, Yongin (KR); Yoon-Hyeung Cho, Yongin (KR); Byoung-Duk Lee, Yongin (KR); Yong-Tak Kim, Yongin (KR); So-Young Lee, Yongin (KR); Yun-Ah Chung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/504,269

(22) Filed: Oct. 1, 2014

(65) Prior Publication Data

US 2015/0108453 A1 Apr. 23, 2015

Related U.S. Application Data (63) Continuation-in-part of application No. 13/088,912, filed on Apr. 18, 2011, now Pat. No. 8,878,201.

(30) Foreign Application Priority Data

Dec. 16, 2010 (KR) .......................... 10-2010-0129285

(51) Int. Cl.
*H01L 51/52* (2006.01)
*H01L 33/56* (2010.01)
(Continued)

(52) U.S. Cl.
CPC ........ *H01L 51/5253* (2013.01); *H01L 23/291* (2013.01); *H01L 23/293* (2013.01);
(Continued)

(58) Field of Classification Search
None
See application file for complete search history.

(56) References Cited

U.S. PATENT DOCUMENTS

| | | | |
|---|---|---|---|
| 4,514,436 A * | 4/1985 | Moerschel | G01R 31/308 205/791 |
| 6,573,652 B1 | 6/2003 | Graff et al. | |

(Continued)

FOREIGN PATENT DOCUMENTS

| | | |
|---|---|---|
| CN | 1426605 A | 6/2003 |
| CN | 1459996 A | 12/2003 |

(Continued)

OTHER PUBLICATIONS

Chinese Office Action dated Apr. 28, 2015 for Chinese Patent Application No. CN 201110215050.8, which shares priority of Korean Patent Application No. KR 10-2010-0129285 with captioned U.S. Appl. No. 14/504,269.

(Continued)

*Primary Examiner* — Bilkis Jahan
(74) *Attorney, Agent, or Firm* — Lewis Roca Rothgerber Christie LLP (57) ABSTRACT

An organic light-emitting display apparatus is disclosed. In one embodiment, the display apparatus includes i) a substrate and ii) an organic light-emitting device formed on the substrate, the organic light-emitting device including a stack structure including a first electrode, an organic light-emitting layer, and a second electrode. The apparatus may further include a sealing layer formed on the substrate so as to cover the organic light-emitting device, the sealing layer including an inorganic layer and a porous layer interposed between the sealing layer and the organic light-emitting device. One embodiment can reduce a stress due to a sealing inorganic layer so as to maintain characteristics for a long time in a (Continued)

severe environment and not affect an organic light-emitting device.

13 Claims, 9 Drawing Sheets

(51) Int. Cl.
    *H01L 33/44*               (2010.01)
    *H01L 23/29*               (2006.01)
    *H01L 27/32*               (2006.01)

(52) U.S. Cl.
    CPC .............. *H01L 27/32* (2013.01); *H01L 33/44* (2013.01); *H01L 33/56* (2013.01); *H01L 51/524* (2013.01); *H01L 51/5237* (2013.01); *H01L 51/5256* (2013.01); *H01L 2924/0002* (2013.01)

(56) References Cited

U.S. PATENT DOCUMENTS

| | | | |
|---|---|---|---|
| 6,635,989 B1 | 10/2003 | Nilsson et al. | |
| 7,067,976 B2 | 6/2006 | Yamazaki | |
| 7,187,119 B2* | 3/2007 | Weaver | H01L 25/047 257/40 |
| 7,301,274 B2* | 11/2007 | Tanaka | H01L 27/3244 313/504 |
| 8,003,999 B2 | 8/2011 | Cho et al. | |
| 8,593,060 B2 | 11/2013 | Lee et al. | |
| 2001/0043043 A1* | 11/2001 | Aoyama | H01L 51/5036 313/506 |
| 2001/0044035 A1* | 11/2001 | Morii | H05B 33/04 428/690 |
| 2003/0085652 A1 | 5/2003 | Weaver | |
| 2003/0218422 A1 | 11/2003 | Park et al. | |
| 2004/0194691 A1 | 10/2004 | George et al. | |
| 2004/0197944 A1 | 10/2004 | Chen et al. | |
| 2005/0104513 A1 | 5/2005 | Lee et al. | |
| 2005/0156520 A1* | 7/2005 | Tanaka | H01L 51/5268 313/512 |
| 2005/0179379 A1* | 8/2005 | Kim | H01L 51/5253 313/512 |
| 2005/0231106 A1* | 10/2005 | Tanaka | H01L 51/5268 313/506 |
| 2006/0232194 A1* | 10/2006 | Tung | H01L 51/5056 313/504 |
| 2007/0152212 A1 | 7/2007 | Cho et al. | |
| 2007/0248808 A1* | 10/2007 | Lee | H01L 51/524 428/319.1 |
| 2007/0252526 A1 | 11/2007 | Aitken et al. | |
| 2008/0203907 A1 | 8/2008 | Lee et al. | |
| 2009/0058268 A1 | 3/2009 | Yoshida et al. | |
| 2011/0163330 A1* | 7/2011 | Kim | H01L 51/5256 257/88 |
| 2012/0235171 A1* | 9/2012 | Kim | H01L 51/5253 257/88 |
| 2013/0069105 A1 | 3/2013 | Shi | |
| 2013/0181602 A1* | 7/2013 | Kang | H01L 51/5256 313/504 |
| 2014/0151671 A1* | 6/2014 | Saitou | H01L 51/5246 257/40 |

FOREIGN PATENT DOCUMENTS

| | | |
|---|---|---|
| CN | 1620201 A | 5/2005 |
| CN | 1992371 A | 7/2007 |
| JP | 2006-120566 A | 5/2006 |
| JP | 3962572 B2 | 5/2007 |
| KR | 10-2004-0085675 A | 10/2004 |
| KR | 10-2008-0078420 | 8/2008 |
| KR | 10-2010-0128459 A | 12/2010 |
| TW | 200421646 A | 10/2004 |
| TW | 200919656 A | 5/2009 |

OTHER PUBLICATIONS

Korean Office Action dated Jun. 30, 2016 for Korean Patent Application No. KR 10-2010-0129285, from which subject U.S. Appl. No. 14/504,269 claims priority.
Korean Registration Determination Certificate dated Mar. 25, 2017 for Korean Patent Application No. KR 10-2010-0129285, from which subject U.S. Appl. No. 14/504,209 claims priority.

* cited by examiner

ORGANIC LIGHT-EMITTING DISPLAY APPARATUS

CROSS-REFERENCE TO RELATED PATENT APPLICATION

This application is a continuation-in-part of application Ser. No. 13/088,912, filed Apr. 18, 2011, which claims the benefit of Korean Patent Application No. 10-2010-0129285, filed on Dec. 16, 2010, in the Korean Intellectual Property Office, the disclosure of which is incorporated herein in its entirety by reference.

BACKGROUND

Field

The described technology generally relates to organic light-emitting display apparatuses, and more particularly, to organic light-emitting display apparatuses having an improved sealing structure.

Description of the Related Technology

Organic light-emitting displays generally have wide viewing angles, high contrast ratios, short response times, and reduced power consumption, and thus may be used across a variety of applications such as personal portable devices (e.g., MP3 players and mobile phones) or large screen displays (e.g., television sets).

The performance of an organic light-emitting display may deteriorate due to permeation of oxygen or moisture. Therefore, an organic light-emitting display generally includes a sealing structure for blocking permeation of oxygen and moisture.

SUMMARY OF CERTAIN INVENTIVE ASPECTS

One inventive aspect is an organic light-emitting display apparatus for reducing a stress due to a sealing inorganic layer so as to maintain characteristics for a long time also in a severe environment and not affect an organic light-emitting device.

Another aspect is an organic light-emitting display apparatus including a substrate; an organic light-emitting device formed on the substrate, the organic light-emitting device including a stack structure including a first electrode, an organic light-emitting layer, and a second electrode; a sealing layer formed on the substrate so as to cover the organic light-emitting device, the sealing layer including an inorganic layer and an organic layer stacked with each other; and a porous layer interposed between the sealing layer and the organic light-emitting device, wherein the inorganic layer may be formed on the porous layer, and wherein the porous layer may include SiNx, SiOx, SiCN, SiON, LiF or combinations thereof.

The porous layer may contact the second electrode of the organic light-emitting device. The organic light-emitting display may further comprise at least one of an inorganic layer or an organic layer, which is interposed between the organic light-emitting device and the porous layer. The sealing layer may prevent the organic light-emitting device and the porous layer from being exposed out of the organic light-emitting display apparatus. The inorganic layer of the sealing layer may contact the porous layer. The inorganic layer contacted with the porous layer, may include a plurality of pin holes.

The porous layer may include LiF.

The inorganic layer of the sealing layer may be thicker than the porous layer.

The porous layer may be thicker than the inorganic layer of the sealing layer.

The porous layer may include a first porous layer and a second porous layer, and a density of the first porous layer may be different from a density of the second porous layer.

The porous layer may further include an organic material.

Another aspect is an organic light-emitting display apparatus including a substrate; an organic light-emitting device formed on the substrate, the organic light-emitting device including a stack structure including a first electrode, an organic light-emitting layer, and a second electrode; a first layer contacting the organic light-emitting device, the first layer including a porous layer; and a second layer formed on the substrate so as to cover the organic light-emitting device and a first layer, contacting the first layer, and including an inorganic layer, wherein the second layer may be formed on the first layer and comprise an inorganic layer and an organic layer stacked with each other, and wherein the porous layer may include SiNx, SiOx, SiCN, SiON, LiF or combinations thereof.

The first layer may contact the second electrode of the organic light-emitting device. The organic light-emitting display may further comprise at least one of an inorganic layer or an organic layer, which is interposed between the organic light-emitting device and the porous layer. The second layer may prevent the organic light-emitting device and the first layer from being exposed out of the organic light-emitting display apparatus. An inorganic layer of the second layer may contact the first layer. The inorganic layer contacted with the porous layer, may include a plurality of pin holes.

The porous layer may include LiF.

The inorganic layer of the sealing layer may be thicker than the porous layer.

The porous layer may be thicker than the inorganic layer of the sealing layer.

The porous layer may include a first porous layer and a second porous layer, and a density of the first porous layer may be different from a density of the second porous layer.

The porous layer may further include an organic material.

DETAILED DESCRIPTION OF CERTAIN INVENTIVE EMBODIMENTS

A thin-film sealing structure using an organic layer and an inorganic layer has been used as a sealing structure for an organic light-emitting display. In addition, a high-density inorganic layer is used in the thin-film sealing structure to effectively prevent the penetration of moisture and air into the display.

However, the high-density inorganic layer causes pressure or tension stress in a thin display application. Such stress affects an OLED beneath the high-density inorganic layer when environmental conditions reach high temperatures and high relative humidity.

If the sealing structure is designed to solely improve barrier characteristics of the inorganic layer only, there may be a tradeoff with other factors. For example, when the sealing structure undergoes severe ambient conditions, a relatively thin and flexible OLED may be harmed. In that case, the lifetime of the organic light-emitting device may be reduced.

Embodiments will now be described more fully with reference to the accompanying drawings.

Figure 1:
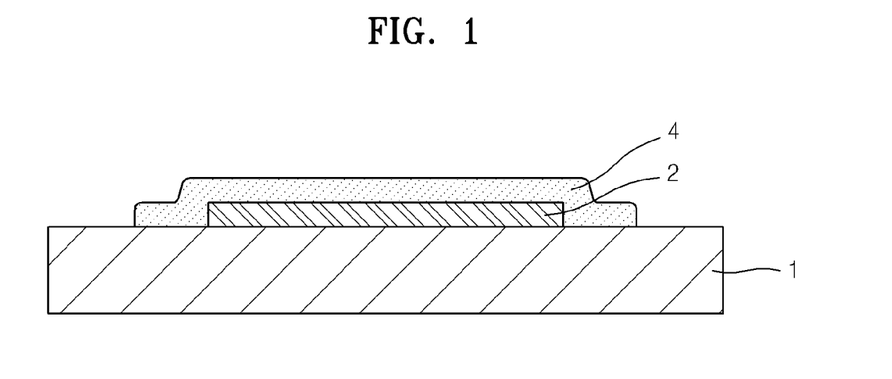
FIG. 1 is a cross-sectional view of an organic light-emitting display apparatus according to an embodiment.
Figure 2:
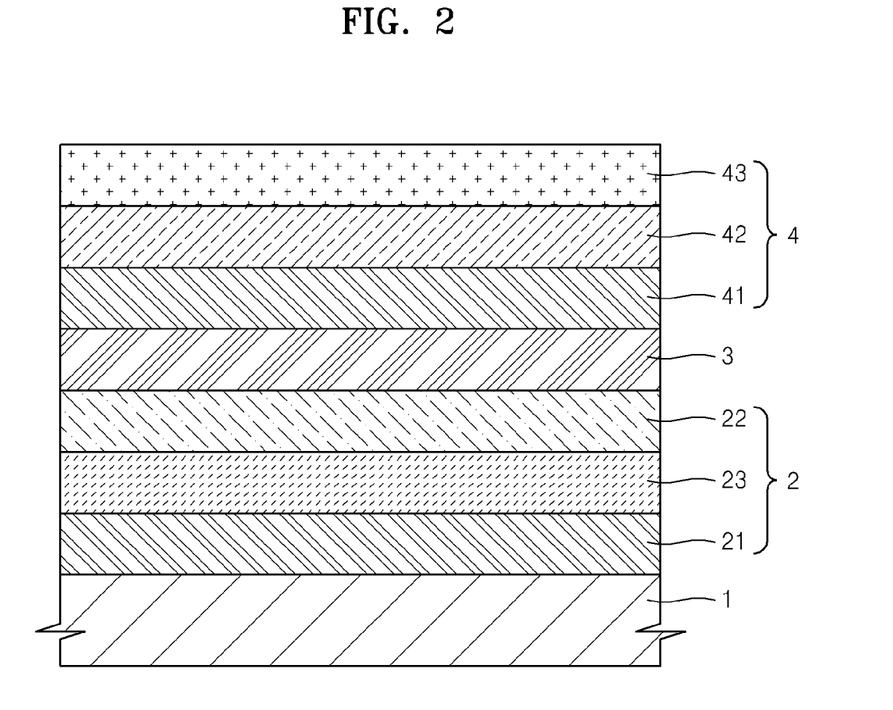
FIG. 2 is a cross-sectional view of a portion of a single pixel of the organic light-emitting display apparatus of FIG. 1.

FIG. 1 is a cross-sectional view of an organic light-emitting display apparatus according to an embodiment. FIG. 2 is a cross-sectional view of a portion of a single pixel of the organic light-emitting display apparatus of FIG. 1.

Referring to FIGS. 1 and 2, an organic light-emitting device 2 is formed on a substrate 1, and a second layer 4 as a sealing layer is formed on the substrate 1 so as to cover the organic light-emitting device 2.

The substrate 1 may be formed at least partially of a glass material, but is not limited thereto, and the substrate 1 may be formed at least partially of metal or plastic.

Although not illustrated in FIGS. 1 and 2, the substrate 1 may include a single pixel circuit per pixel, and the pixel circuit may include at least one thin film transistor (TFT) and a capacitor.

As illustrated in FIG. 2, the organic light-emitting device 2 includes a first electrode 21, a second electrode 22, and an organic light-emitting layer 23 interposed between the first electrode 21 and the second electrode 22.

The first electrode 21 is electrically connected to the TFT included in the substrate 1.

The first and second electrodes 21 and 22 face each other and are electrically insulated from each other by the organic light-emitting layer 23.

The first and second electrodes 21 and 22 may function as an anode and a cathode, respectively, or polarities of the first electrode 21 and the second electrode 22 may be opposite to this.

When the first electrode 21 is used as an anode, the first electrode 21 may be formed of a material with a high absolute value of a work function. When the second electrode 22 is used as a cathode, the second electrode 22 may be formed of a material of a lower absolute value of a work function than that of the first electrode 21. When the polarities of the first and second electrodes 21 and 22 are opposite to this, the materials of the electrodes 21 and 22 may be opposite to the ones where the electrodes 21 and 22 function as an anode and a cathode. Hereinafter, a case where the first electrode 21 is used as an anode and the second electrode 22 is used as a cathode will be described.

The first electrode 21 may be formed at least partially of a transparent metal oxide selected from at least one of indium tin oxide (TTO), indium zinc oxide (IZO), ZnO, and $In_2O_3$. The second electrode 22 may be formed at least partially of at least one metal selected from aluminum (Al), silver (Ag), magnesium (Mg) and chromium (Cr).

When the organic light-emitting display apparatus is a bottom emission type display apparatus where an image is realized towards the substrate 1, the second electrode 22 may be formed to be relatively thick, thereby increasing the luminescent efficiency towards the substrate 1.

When the organic light-emitting display apparatus is of a top emission type display apparatus where an image is related towards the second layer 4, the second electrode 22 may function as a semi-transmissive reflective layer by forming the second electrode 22 to be thin. Alternatively, the second electrode 22 may be formed of a transparent conductive material other than the above-described materials. In this case, the first electrode 21 may further include a reflective layer.

In one embodiment, the organic light-emitting layer 23 has a stack structure in which a plurality of organic layers including an emission layer (EML) are staked. A hole transport layer (HTL), a hole injection layer (HIL), or the like may be disposed between the EML and the first electrode 21, and an electron transport layer (ETL), an electron injection layer (EIL), or the like may be disposed between the EML and the second electrode 22.

In FIG. 2, the second layer 4 may have a stack structure in which an organic layer 42 is interposed between a first inorganic layer 41 and a second inorganic layer 43. However, the present embodiment is not limited thereto, and the second layer 4 may have a stack structure in which a plurality of inorganic layers and a plurality of organic layers are alternately stacked. At least one of the inorganic layers of the second layer 4 is formed of aluminum oxide, alumino silicate, silicon oxide, silicon oxinitride, silicon nitride, or combinations thereof. At least one of the organic layers of the second layer 4 is formed of acrylate, thiol, epoxy, polyester, siloxane, urethane, or combinations thereof.

A first layer 3 is interposed between the second layer 4 and the organic light-emitting device 2.

The first layer 3 contacts each of the organic light-emitting device 2 and the second layer 4, and prevents a stress from increasing due to an organic layer included in the second layer 4. The first layer 3 may contact the second electrode 22 of the organic light-emitting device 2. In addition, the first layer 3 may contact the first inorganic layer 41 of the second layer 4. In this case, the first layer 3 may further prevent the stress from increasing. To this end, the first layer 3 may include a porous layer.

Since the first layer 3 includes a porous layer, a function of reducing the stress by the first layer 3, instead of a function of preventing the penetration of moisture and air by the second layer 5, may be further improved.

Since the porous layer is formed of an inorganic material, the first layer 3 may prevent the stress from increasing due to the second layer 4, in particular, due to at least one of the first and second inorganic layers 41 and 43.

The porous layer of the first layer 3 may be formed at least partially of a material such as SiNx, SiOx, SiCN, SiON, LiF or combinations thereof. The porous layer of the first layer 3 may be formed using a plasma-enhanced chemical vapor deposition (PECVD) method or a thermal evaporation method. During the PECVD method, the porous layer may be formed with a reduced plasma ion density. The porous layer of the first layer 3 may have a crystalline structure, thus the porous layer may have a higher density than an inorganic layer of the second layer 4.

A thickness of the first layer 3 may be smaller than that of the second layer 4. If the thickness the first layer 3 is greater than that of the second layer 4, since tranmissivity for visible rays is reduced in a top emission type display apparatus, the first layer 3 may be formed to have a minimum thickness as long as the stress due to the second layer 4 is prevented. The thickness of the first layer 3 may be smaller than that of the first inorganic layer 41 of the second layer 4.

A thickness of the first layer 3 may be thicker than that of the first inorganic layer 41 of the second layer 4. If the second layer 4 may have a stack structure in which a plurality of inorganic layers and a plurality of organic layers are alternately stacked, since the stress due to the second layer 4 is strong, the first layer 3 may be thicker than that of the first inorganic layer 41 of the second layer 4. The porous layer of the first layer 3 may further comprise an organic material.

In FIG. 2, the first layer 3 includes a single porous layer, but the present embodiment is not limited thereto, and the porous layer may be variously formed.

Figure 3:
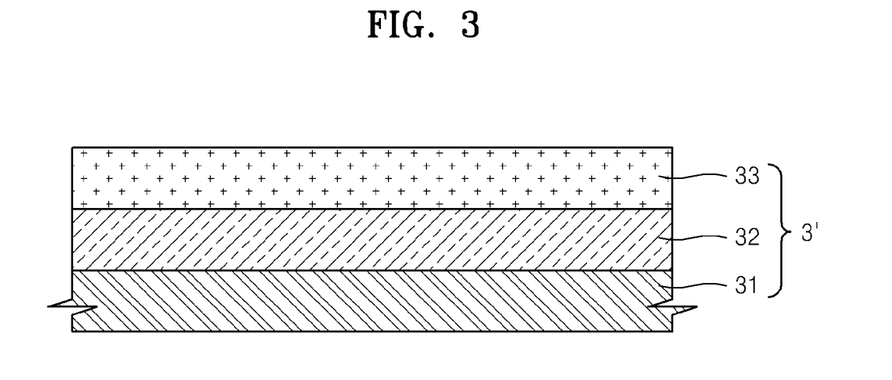
FIG. 3 is a cross-sectional view of a first layer according to another embodiment.

For example, FIG. 3 is a cross-sectional view of a first layer 3' according to another embodiment. Referring to FIG. 3, the first layer 3' includes a plurality of porous layers. The porous layers may have at least two porous layers with different densities. In FIG. 3, the first layer 3' has a stack structure including a first porous layer 31, a second porous layer 32, and a third porous layer 33.

In one embodiment, the porous layers 31-33 have different layer densities. In one embodiment, the first porous layer 31 has the lowest density. In this embodiment, the third porous layer 33 has the highest density. That is, the porous layers may have a density gradient formed in such a way that density increases from the first porous layer 31 to the third porous layer 33. The density gradient may be substantially gradually increased.

The first layer 3' including a plurality of porous layers may have a greater thickness than the thickness of the first layer 3 as shown in FIG. 2 including a single porous layer.

Figure 4:
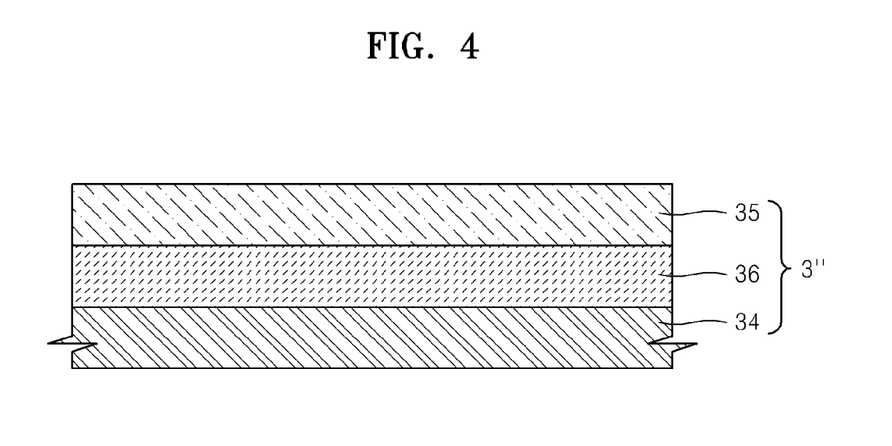
FIG. 4 is a cross-sectional view of a first layer according to another embodiment.

FIG. 4 is a cross-sectional view of a first layer 3" according to another embodiment.

The first layer 3" is formed at least partially of SiCN by using a PECVD method. A fourth porous layer 36 formed of, for example, carbon or a carbon-containing material is formed between a third inorganic layer 34 and a fourth inorganic layer 35 formed of SiN.

The fourth porous layer 36 formed of carbon may not have barrier characteristics, and may prevent a stress from increasing due to the first layer 3" including an inorganic layer and the second layer 4 formed on the first layer 3".

Figure 5:
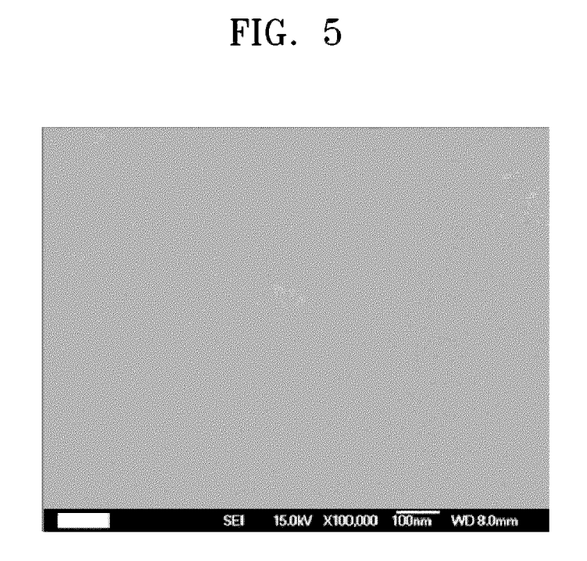
FIG. 5 is a transmission electron microscope (TEM) image of a high-density SiNx layer formed on an organic light-emitting device.
Figure 6:
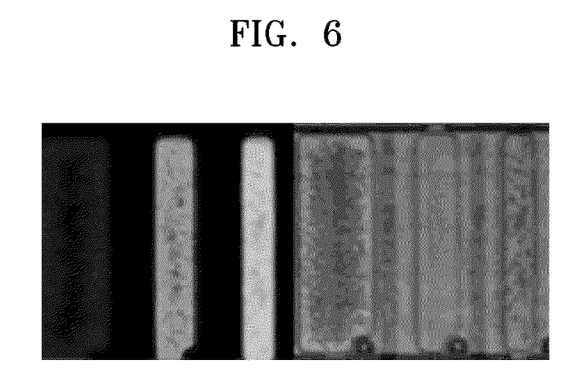
FIG. 6 shows a pixel formed by alternately forming organic layers and inorganic layers on the high-density SiNx layer to form a thin-film sealing structure and then maintaining the thin-film sealing structure at high temperatures and high moistures for about 100 hours.

FIG. 5 is a transmission electron microscope (TEM) image of a high-density SiNx layer formed on an organic light-emitting device. FIG. 6 shows a pixel formed by alternately forming organic layers and inorganic layers on the high-density SiNx layer to form a thin-film sealing structure and then maintaining the thin-film sealing structure at high temperatures and high moistures for about 100 hours. In FIG. 6, a left side shows a light-emitting state, and a right side shows a non-emitting state.

The high density SiNx layer has excellent barrier characteristics due to a high density. However, since the high density SiNx layer influences an organic light-emitting device formed below the high density SinX layer due to a strong stress, dark spots are shown, as illustrated in FIG. 6.

Figure 7:
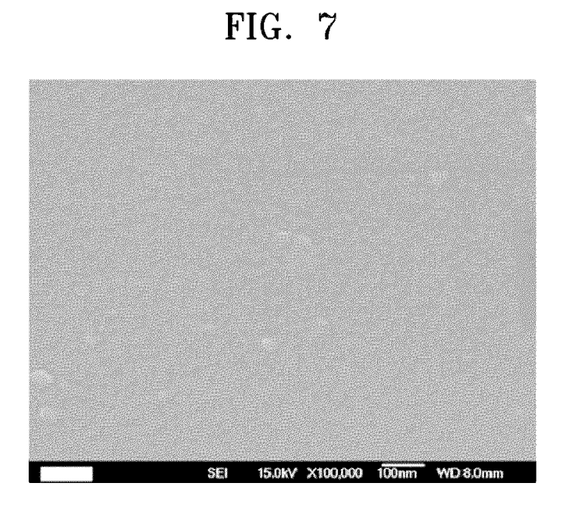
FIG. 7 is a TEM image of a porous SiNx layer having almost no barrier characteristics.
Figure 8:
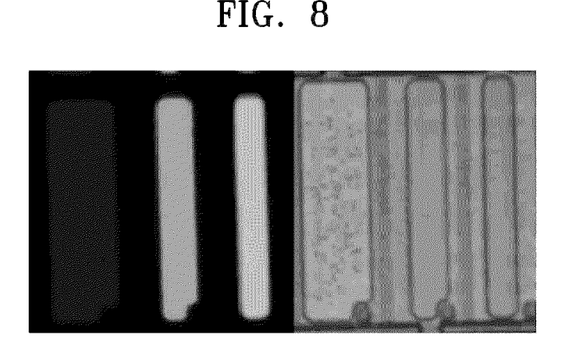
FIG. 8 is a TEM image of a pixel formed by interposing the porous SiNx layer between the thin-film sealing structure and the organic light-emitting device and then maintaining the resulting structure at high temperatures and high moistures for about 240 hours.

FIG. 7 is a TEM image of a porous SiNx layer having almost no barrier characteristics. FIG. 8 is a TEM image of a pixel formed by interposing the porous SiNx layer between the thin-film sealing structure and the organic light-emitting device and then maintaining the resulting structure at high temperatures and high moistures for about 240 hours. In FIG. 8, a left side shows a light-emitting state and a right side shows a non-emitting state.

Likewise, by further interposing the porous SiNx layer with almost no barrier characteristics, the number of black spots may be reduced, as shown in FIG. 6.

Figure 9:
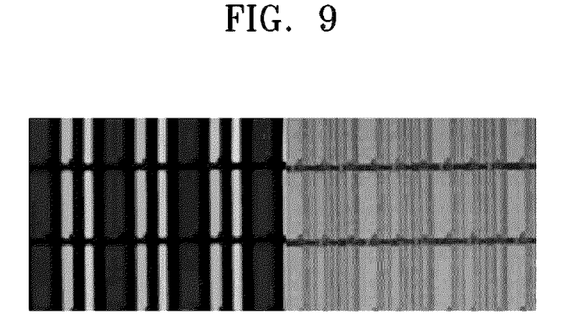
FIG. 9 is a TEM image of a pixel formed by forming a layer shown in FIG. 3 while dividing a porous SiNx layer into three layers to increase a plasma ion density to a third level and then maintaining the resulting structure at high temperatures and high moistures for about 500 hours.

FIG. 9 is a TEM image of a pixel formed by forming a layer as shown in FIG. 3 by dividing a porous SiNx layer into three layers to increase a plasma ion density to a third level and then maintaining the resulting structure at high temperatures and high moistures for about 500 hours.

As shown in FIG. 9, even though a severe environment is maintained for a long period of time, the number of black spots is reduced.

A structure with no black spots, that is, the porous SiNx layer, has almost no barrier characteristics. The porous SiNx layer prevents a stress. The porous layer has a higher Si—H bonding ratio and a lower Si—N bonding ratio than that of a SiNx layer having a barrier characteristics. Thus, the porous SiNx layer may be formed to have a high Si—H bonding ratio in order to prevent the stress from increasing.

Figure 10:
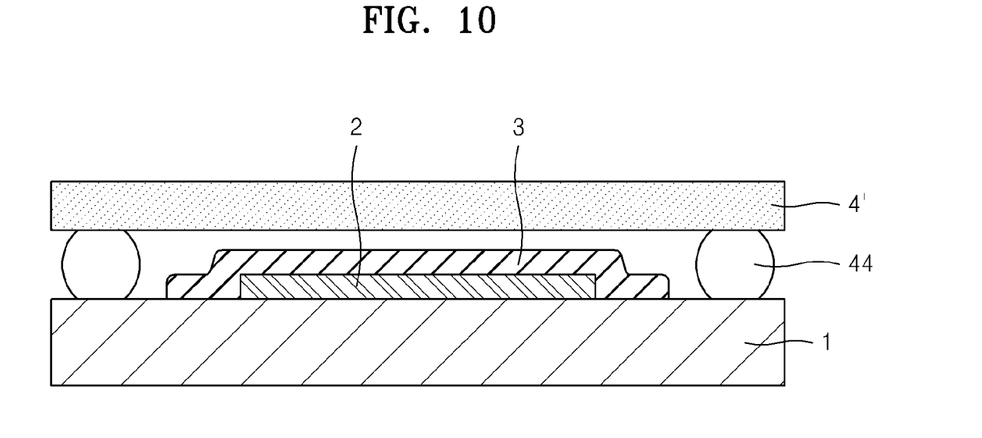
FIG. 10 is a cross-sectional view of an organic light-emitting display apparatus according to another embodiment.

The porous SiNx layer is not used only in the above-described sealing structure. As shown in FIG. 10, in a structure in which a sealing substrate 4' is adhered to the substrate 1 by a sealing member 44, the first layer 3 may be used as a passivation layer for covering the organic light-emitting device 2. Alternatively, as shown in FIG. 1, the second layer 4 may be further formed also on the passivation layer. In addition, the structures show in FIGS. 2 through 4 may be used as the first layer 3.

A first layer as a porous layer does not have to contact a second electrode. In addition, when the first layer is interposed between the second electrode and an inorganic layer as a high-density barrier layer, the first layer may effectively prevent a stress, thereby preventing minute black spots of a pixel from forming.

Figure 11:
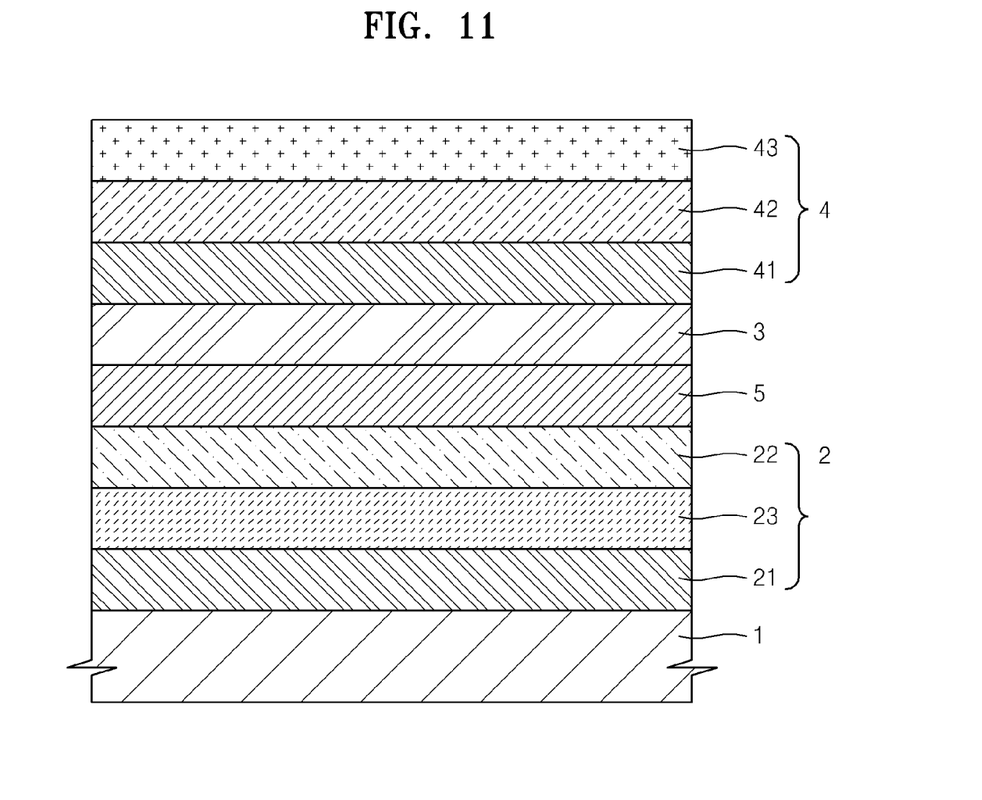
FIG. 11 is a cross-sectional view of a single pixel of FIG. 1 according to an embodiment.

That is, as shown in FIG. 11, a capping layer 5 that is for realizing resonance of the organic light-emitting device 2 may be formed on the second electrode 22, the first layer 3 may be formed on the capping layer 5, and the second layer 4 may be further formed on the first layer 3. The capping layer 5 may be formed at least partially of an inorganic material, an organic material, or combinations thereof.

A compound shown by the following formula (1) is an exemplary embodiment for the material for the capping layer.

(1)

wherein n is an integer from 2 to 4 (2 in an exemplary embodiment), $Ar_{40}$ to $Ar_{43}$ are independently a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), or a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthriazine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), and $R_{41}$ to $R_{43}$ are independently a hydrogen atom, a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthriazine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), a substituted or unsubstituted alkyl group having 1 to 50 carbon atoms (e.g., methyl group, ethyl group, n-propyl group, isopropyl group, n-butyl group, sec-butyl group, or tert-butyl group), a substituted or unsubstituted cycloalkyl group (e.g., cyclopentyl group, cyclohexyl group, or cycloheptyl group), a substituted or unsubstituted alkoxy group having 1 to 50 carbon atoms (e.g., methoxy group or ethoxy group), a substituted or unsubstituted aralkyl group having 6 to 50 carbon atoms (e.g., benzyl group), a substituted or unsubstituted aryloxy group having 5 to 50 atoms (e.g., phenoxy group), a substituted or unsubstituted alkoxycarbonyl group having 1 to 50 carbon atoms (e.g., methylcarbonyl group), a substituted or unsubstituted silyl group (e.g., trialkylsilyl group (e.g., trimethylsilyl group or tert-butyldimethylsilyl group) or arylalkylsilyl group (e.g., phenyldimethylsilyl group or tert-butyldiphenylsilyl group)), a carboxyl group, a halogen atom (e.g., fluorine atom), a cyano group, a nitro group, or a hydroxy group.

Figure 12:
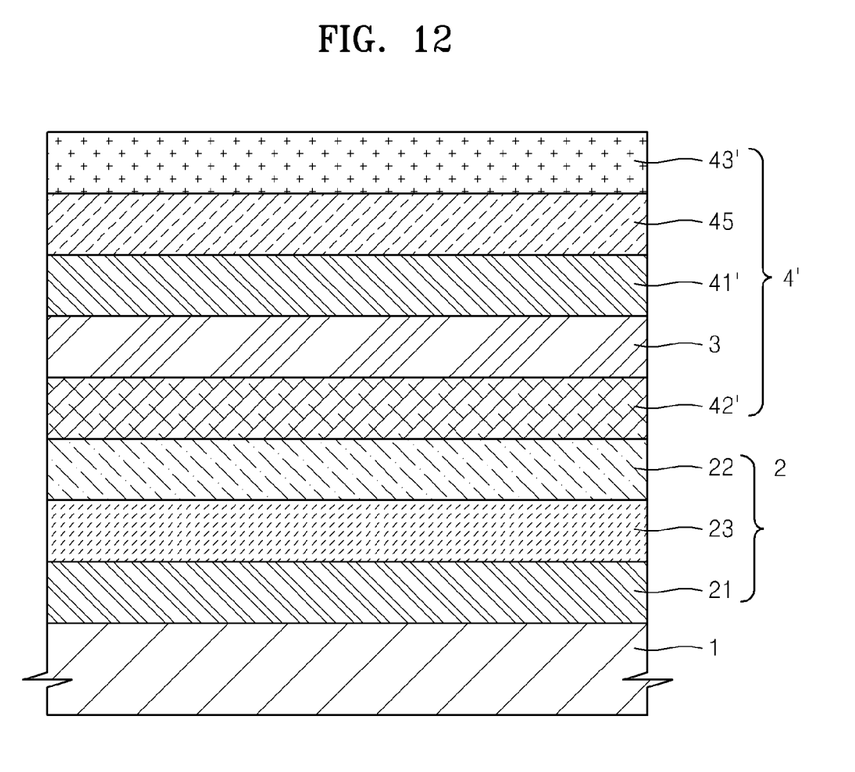
FIG. 12 is a cross-sectional view of a single pixel of FIG. 1 according to an embodiment.

As shown in FIG. 12, the first layer 3 as the porous layer may be included in a second layer 4' as a sealing layer. That is, a first organic layer 42' of the second layer 4' as a sealing layer is formed on the second electrode 22, and then the first layer 3 is formed on the first organic layer 42'. A sealing layer formed by sequentially forming a first inorganic layer 41', a second organic layer 45, and a second inorganic layer 43' is formed on the first layer 3. In this structure, since the first inorganic layer 41' and the second inorganic layer 43' constitute a high-density barrier, a stress may be increased. However, the stress may be reduced by interposing the first layer 3 between the first inorganic layer 41' and the first organic layer 42', thereby preventing minute black spots from being formed.

Figure 13:
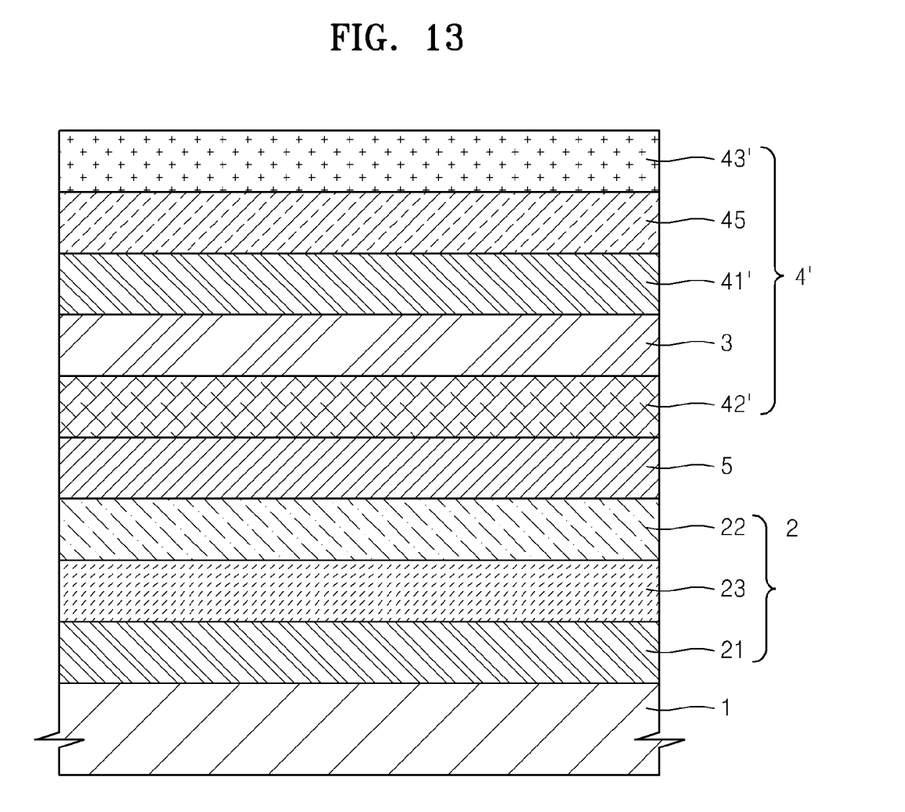
FIG. 13 is a cross-sectional view of a single pixel of FIG. 1 according to an embodiment.

FIG. 13 is a cross-sectional view of a single pixel formed by applying the pixels of FIGS. 11 and 12, according to another embodiment. The pixel of FIG. 13 is formed by further interposing a capping layer 5 of FIG. 11 between the second electrode 22 and the first organic layer 42' of FIG. 12. Also, since the first and second inorganic layers 41' and 43' constitute a high-density barrier, a stress may be increased. However, the stress may be reduced by interposing the first layer 3 between the first inorganic layer 41' and the first organic layer 42', thereby preventing minute black spots from being formed.

Also, in FIGS. 11 through 13, the stack order and the number of layers included in the second layer 4 or 4' are not particularly limited. That is, a plurality of organic layers and a plurality of inorganic layers may be further and alternately stacked, which may also be applied to the structure of FIG. 10.

Figure 14:
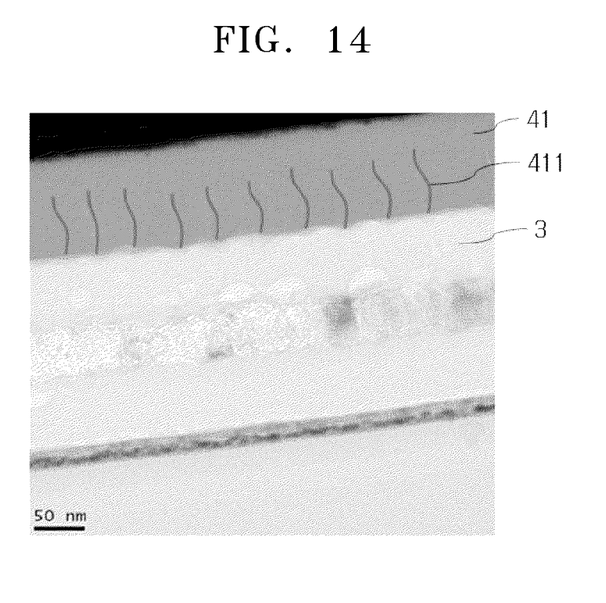
FIG. 14 is a TEM image of an inorganic layer of the second layer formed on the porous layer according to another embodiment.

FIG. 14 is a TEM image of an inorganic layer 41 of the second layer formed on the porous layer 3 according to another embodiment.

The inorganic layer 41 is formed of aluminum oxide, and the porous layer 3 is formed of LiF. At least a part of the porous layer 3 has a crystalline structure as shown at FIG. 14. Furthermore, the inorganic layer 41 contacts the porous layer 3 and has a plurality of pin holes 411. The pin holes 411 extend from a boundary between the inorganic layer 41 and the porous layer 3. Thus the inorganic layer 41 may prevent the stress from increasing due to the second layer 4.

The porous layer according to another embodiment may be formed of silicon oxide having a similar refractive index with that of the LiF porous layer. That is, the silicon oxide porous layer has a refractive index less than 1.4.

Figure 15A:
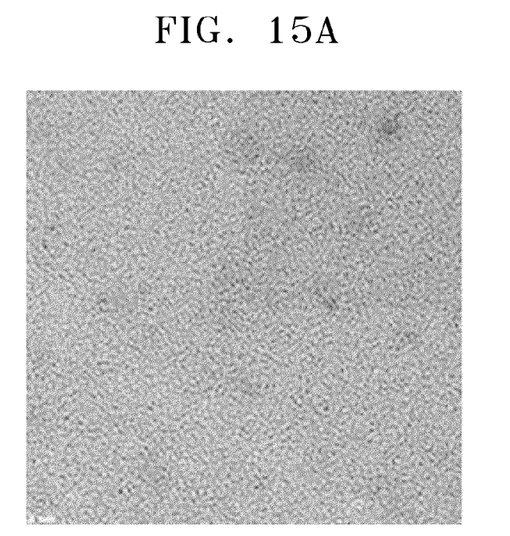
FIG. 15A is a TEM image of a silicon oxide layer having a refractive of 1.45
Figure 15B:
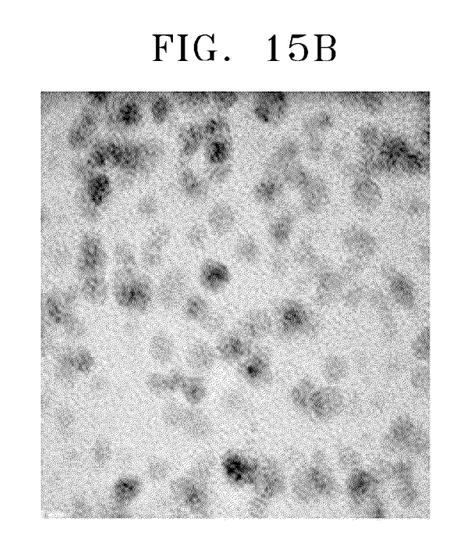
FIG. 15B is a TEM image of a silicon oxide layer having a refractive of 1.35.

FIGS. 15A and 15B are TEM images of silicon oxide layers.

The silicon oxide layer of FIG. 15A has a refractive of 1.45 and the silicon oxide layer of FIG. 15B has a refractive of 1.35. As shown at FIG. 15B, the silicon oxide layer having a refractive index less than 1.4, has a porous structure.

According to at least one of the disclosed embodiments, an organic light-emitting device may not be substantially affected by a stress due to a layer covering the organic light-emitting device, thereby preventing minute black spots of each pixel from being formed, and maintaining luminescent characteristics for a long time.

While embodiments have been shown and described with reference to the accompanying drawings, it will be understood by those of ordinary skill in the art that various changes in form and details may be made therein without departing from the spirit and scope of the following claims.

What is claimed is:

1. An organic light-emitting display apparatus comprising:
a substrate;
an organic light-emitting device disposed over the substrate, wherein the organic light-emitting device has a stack structure which comprises a first electrode, a second electrode, and an organic light-emitting layer between the first electrode and the second electrode;
a sealing layer disposed over the substrate so as to cover the organic light-emitting device, wherein the sealing layer comprises an inorganic layer and an organic layer stacked with each other;
a porous layer interposed between the sealing layer and the organic light-emitting device; and
a capping layer interposed between the porous layer and the organic light-emitting device, wherein the capping layer directly contacts the second electrode,
wherein the inorganic layer is disposed directly on the porous layer to form a boundary therebetween,
wherein the porous layer is disposed directly on the capping layer,
wherein the inorganic layer and the capping layer are not porous,
wherein the porous layer comprises a material selected from the group consisting of SiNx, SiOx, SiCN, SiON, LiF and combinations thereof, and
wherein the capping layer comprises an organic material.

2. The organic light-emitting display apparatus of claim 1, wherein the porous layer contacts the second electrode of the organic light-emitting device.

3. The organic light-emitting display apparatus of claim 1, wherein the porous layer comprises LiF.

4. The organic light-emitting display apparatus of claim 1, wherein the inorganic layer of the sealing layer is thicker than the porous layer.

5. The organic light-emitting display apparatus of claim 1, wherein the porous layer is thicker than the inorganic layer of the sealing layer.

6. The organic light-emitting display apparatus of claim 1, wherein the porous layer further comprises an organic material.

7. The organic light-emitting display apparatus of claim 1, wherein the porous layer comprises a third porous layer having a density that is different from densities of a first porous layer and a second porous layer of the porous layer, and
wherein the first to third porous layers define a density gradient in which the density of the porous layer increases in a direction from the organic light-emitting device towards the sealing layer.

8. An organic light-emitting display apparatus comprising:
a substrate;
an organic light-emitting device disposed over the substrate, wherein the organic light-emitting device has a stack structure which comprises a first electrode, a second electrode, and an organic light-emitting layer between the first electrode and the second electrode;
a first layer over the organic light-emitting device, wherein the first layer comprises a porous layer;
a second layer disposed over the substrate so as to cover the organic light-emitting device and the first layer, wherein the second layer contacts the first layer; and
a capping layer interposed between the first layer and the organic light-emitting device, wherein the capping layer directly contacts the second electrode,
wherein the second layer is disposed over the first layer and comprises an inorganic layer and an organic layer stacked with each other,
wherein the inorganic layer is disposed directly on the porous layer to form a boundary therebetween,
wherein the porous layer is disposed directly on the capping layer,
wherein the inorganic layer and the capping layer are not porous,
wherein the porous layer comprises a material selected from the group consisting of SiNx, SiOx, SiCN, SiON, LiF and combinations thereof, and
wherein the capping layer comprises an organic material.

9. The organic light-emitting display apparatus of claim 8, wherein the first layer contacts the second electrode of the organic light-emitting device.

10. The organic light-emitting display apparatus of claim 8, wherein the porous layer comprises LiF.

11. The organic light-emitting display apparatus of claim 8, wherein the inorganic layer of the second layer is thicker than the porous layer.

12. The organic light-emitting display apparatus of claim 8, wherein the porous layer is thicker than the inorganic layer of the second layer.

13. The organic light-emitting display apparatus of claim 8, wherein the porous layer further comprises an organic material.

* * * * *